United States Patent [19]

Beezley

[11] Patent Number: 5,182,456
[45] Date of Patent: Jan. 26, 1993

[54] NOISE ATTENUATING CIRCUIT FOR MECHANICAL RELAY INCLUDING OPTICAL ISOLATION

[75] Inventor: Dale L. Beezley, Sunnyvale, Calif.

[73] Assignee: The United States of America as represented by the Secretary of the Navy, Washington, D.C.

[21] Appl. No.: 841,606

[22] Filed: Feb. 25, 1992

[51] Int. Cl.⁵ .............................................. G02B 27/00
[52] U.S. Cl. ...................................... 250/551; 307/311
[58] Field of Search ................ 250/551, 216; 307/311; 335/63, 86

[56] References Cited

U.S. PATENT DOCUMENTS 4,461,955  7/1984  Bezdek ................................. 250/551
5,043,587  8/1991  Miki et al. ........................... 250/551

Primary Examiner—David C. Nelms
Attorney, Agent, or Firm—Kenneth L. Warsh

[57] ABSTRACT

An electrical noise reduction circuit which includes field-effect transistors and a photocoupler, for use in alternating current circuits in conjunction with an electro-mechanical relay. The circuit essentially reduces the function of the electro-mechanical relay to that of a safety block, the function of contact closing being taken over by the time-delayed semiconductor devices of the noise reduction circuit.

1 Claim, 1 Drawing Sheet

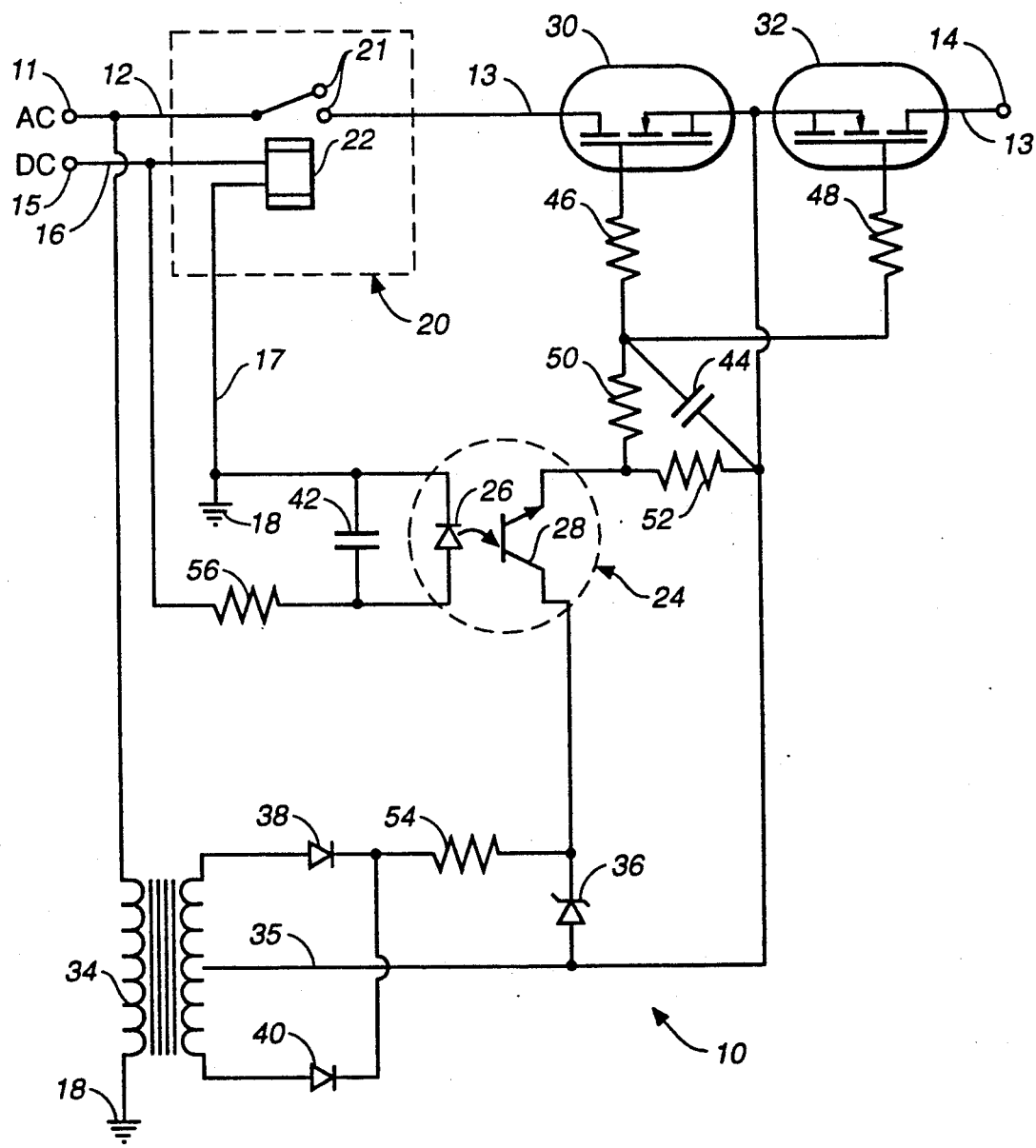
FIG._1

NOISE ATTENUATING CIRCUIT FOR MECHANICAL RELAY INCLUDING OPTICAL ISOLATION

FIELD OF THE INVENTION

This invention pertains in general to circuitry for reducing transient electrical noise in alternating current circuits, and more particularly to circuitry for attenuating high-frequency electrical noise produced by the closing of contacts in electro-mechanical relays.

BACKGROUND OF THE INVENTION

Circuitry consisting of resistive, inductive, and capacitive elements (RLC circuits) has long been used to attenuate transient noise in direct current electrical circuits. However, it has not always been possible to successfully employ RLC circuits to attenuate noise alternating current circuits, due to the high rate of change of voltage with respect to time inherent in alternating current circuits. For example, in a 165 volt root-mean-square (rms) 8,000 hertz application, it was found difficult to attenuate noise having a frequency above one-hundred mega-hertz.

Therefore a need exists for noise attenuation circuitry that will protect sensitive integrated circuit components from being damaged by transient high-frequency noise generated by electro-mechanical relays.

OBJECT, FEATURES, AND ADVANTAGES

It is a primary objective of the present invention to protect sensitive integrated circuit components in alternating current circuits from being damaged by transient high-frequency noise generated by the closing of electro-mechanical relay contacts.

It is a feature of the present invention to place metal oxide field effect transistors (MOSFETs) in series between the electro-mechanical relay and sensitive integrated circuit components.

It is a feature of the present invention to utilize a photocoupler to electrically isolate the direct current relay circuit (which energizes the electro-mechanical relay coil) from all other circuits.

It is a feature of the present invention to utilize a floating ungrounded rectifying circuit incorporating a zener diode to provide voltage-stabilized direct current for activating the MOSFETs.

It is a feature of the present invention to utilize a RLC circuit to delay the activation of the light emitting diode in the photocoupler.

It is a feature of the present invention to utilize a RLC circuit to delay the activation of the MOSFETs.

It is an advantage of the present invention that the inherent safety and reliability of an electro-mechanical relay is combined with the inherent low noise characteristics of semiconductor devices.

SUMMARY OF THE INVENTION

The noise attenuating circuit illustrated consists of a photocoupler (a light-emitting diode and a phototransistor), a step-down transformer having a secondary center tap, two MOSFETs, one zener diode, two diodes, two capacitors, and six resistors. When the foregoing elements, together with an electro-mechanical relay, are connected together via the illustrated circuit they comprise a new and useful device combining the safety features of the relay with the electrical quietness of a purely semiconductor device.

In essence the function of the electro-mechanical relay is reduced to that of a safety block, the function of contact closing being taken over by the time-delayed semiconductor devices.

BRIEF DESCRIPTION OF THE DRAWINGS

The sole FIGURE is a schematic diagram showing the noise attenuating circuit of the present invention, which is connected to an electro-mechanical relay shown enclosed within the dashed rectangle.

DRAWING REFERENCE NUMERALS 10 noise attenuating circuit
11 input terminal for alternating current
12 relay input lead
13 relay output lead
14 output terminal for alternating current
15 input terminal for direct current
16 coil input lead
17 coil ground lead
18 common electrical ground
20 electro-mechanical delay
21 relay mechanical contacts
22 electro-mechanical relay coil (5.0 henrys)
24 photocoupler (TIL-111 Optocoupler)
26 light emitting diode
28 phototransistor
30 first metal oxide silicon field effect transistor (IRH 450)
32 second metal oxide silicon field effect transistor (IRH 450)
34 step-down transformer with center tap on secondary
35 center tap floating ground
36 zener diode (15 volt)
38 first diode (1N4002)
40 second diode (1N4002)
42 first capacitor (0.22 µf)
44 second capacitor (1.0 µf)
46 first resistor (750Ω)
48 second resistor (750Ω)
50 third resistor (30 kΩ)
52 fourth resistor (30 kΩ)
54 fifth resistor (10 kΩ)
56 sixth resistor (2 kΩ)

DESCRIPTION OF THE PREFERRED EMBODIMENT

Referring now to the schematic diagram of the sole FIGURE, there is shown the noise attenuating circuit 10 of the present invention, connected to a normally-open electro-mechanical relay 20 shown enclosed within the dashed rectangle.

Relay 20 is connected in series between AC input terminal 11 and first MOSFET 30 by relay input lead 12 and relay output lead 13 respectively. First MOSFET 30 is next connected in series with second MOSFET 32, which is in turn connected in series to AC output terminal 14.

The coil input lead 16 of relay coil 22 is connected to DC input terminal 15; the coil ground lead 17 is connected to common ground 18. A light-emitting diode (LED) 26 and a first capacitor 42 are connected to each other in parallel; then they are connected in series with sixth resistor 56 across the two leads 16 and 17 of relay coil 22. The LED 26 along with phototransistor 28 are elements of photocoupler 24, which serves to electrically isolate the direct current relay coil circuit from other circuits.

The primary side of a center-tap step-down transformer 34 is connected between the AC input relay lead 12 and common ground 18; a first diode 38 is connected to one end of the secondary side, and a second diode 40 is connected to the other end. The opposite ends of the two diodes 38 and 40 are connected together and to the first end of fifth resistor 54. A zener diode 36 is connected between the secondary side center tap floating ground 35 of transformer 34 and the second end of resistor 54. A rectified voltage-stabilized direct current is thus established across the connections of zener diode 36. This rectified direct current is transmitted (via phototransistor 28, and thence via a voltage activation delay network for the field effect transistor 30 and 32 consisting of third resistor 50, fourth resistor 52, and second capacitor 44) to bias both the gate of first MOSFET 30 (via an associated first resistor 46) and the gate of second MOSFET 32 (via an associated second resistor 48).

In operation, when a direct current (DC) voltage is applied (across DC terminal 15 and common ground 18) to relay coil 22, the contacts 21 of relay 20 close, passing alternating current (AC) voltage to first MOSFET 30. The AC voltage (applied across AC terminal 11 and common ground 18) is stepped down by transformer 34, and then full-wave rectified by first diode 38 and second diode 40; the zener diode 36 limits the magnitude of this rectified voltage (which will be applied to the gates of first MOSFET 30 and second MOSFET 32). The current activation delay network (consisting of sixth resistor 56 and first capacitor 42) for the light-emitting diode (LED) 26 delays the rise of direct current in the LED 26 of photocoupler 24. As the current in LED 26 rises, the phototransistor 28 within photocoupler 24 turns on, transmitting rectified voltage (via the voltage activation delay network for the field effect transistors) to the gates of first MOSFET 30 and second MOSFET 32.

The values for the components are selected so that the delay produced lasts longer than the bouncing of the delay contacts 21; hence the AC output (across AC output terminal 14 and common ground 18) will not transmit any of the high-frequency noise usually generated by relay contacts 21 closing. Values for the components (or other descriptive information) that were used for a breadboard prototype are given, in parentheses, in the preceding list of drawing reference numerals. The step-down transformer 34 was built on a 52168-1A core, with 581 turns on the primary and 116 turns on the secondary. For the breadboard prototype, the frequencies generated by the turn-on transient of first MOSFET 30 and second MOSFET 32 was on order of 1 MHz, compared to frequencies above 100 MHz produced by the relay 20 alone. When first MOSFET 30 and second MOSFET 32 turned on, they turned on in the time span on the order of a microsecond, which is very slow compared to the nanosecond rise times produced by bouncing contacts.

The foregoing method of reducing high-frequency electrical noise is applicable in a system that has vulnerable integrated circuit components, and where safety dictates that relay contacts shall be in series with the AC power source. This allows the relay contacts to act as safety blocks, while at the same time protecting the downstream components from high-frequency contact noise.

While this invention has been described in conjunction with a preferred embodiment thereof, it is obvious that modifications and changes therein may be made by those skilled in the art without departing from the scope of this invention as defined by the claims appended hereto.

That which is claimed is:

1. An electrical noise attenuating circuit, disposed to connect to a normally-open electro-mechanical relay having mechanical relay contacts and a relay coil, the relay contacts being electrically connected to an AC input terminal by a relay input lead and to an AC output terminal by a relay output lead, the relay coil being electrically connected to a DC input terminal by a coil input lead and to a common ground by a coil ground lead, said noise attenuating circuit comprising:

at least two field effect transistors having gates, connected together in series and disposed to be inserted into the relay output lead between the relay contacts and the AC output terminal;

rectifying means for producing a rectified voltage-stabilized direct current, disposed to be electrically connected between the relay input lead and the common ground;

coupling means for providing electrically isolated coupling to the relay coil circuit, including a light-emitting diode and a photo-transistor, said phototransistor being electrically connected by a first lead to the rectified direct current output of said rectifying means;

current delay means for delaying the rise of current in said light-emitting diode, electrically connected to said light-emitting diode and disposed to connect to the coil input lead and to the coil ground lead; and voltage delay means for delaying the rise of voltage applied to the gates of said field-effect transistors, electrically connecting with said field-effect transistors and with a second lead of said phototransistor and with a floating ground of said rectifying means.

* * * * *